United States Patent [19]

Enstrom

[11] 4,053,920

[45] Oct. 11, 1977

[54] STEP GRADED PHOTOCATHODE

[75] Inventor: Ronald E. Enstrom, Skillman, N.J.

[73] Assignee: The United States of America as represented by the Secretary of the Army, Washington, D.C.

[21] Appl. No.: 753,158

[22] Filed: Dec. 21, 1976

Related U.S. Application Data

[63] Continuation of Ser. No. 630,234, Nov. 10, 1975, abandoned.

[51] Int. Cl.[2] .............................................. H01L 27/14

[52] U.S. Cl. .......................................... 357/30; 357/16

[58] Field of Search .............................. 357/30, 17, 16

[56] References Cited

U.S. PATENT DOCUMENTS 3,995,303 11/1976 Nohory ................................. 357/30

*Primary Examiner*—Martin H. Edlow

*Attorney, Agent, or Firm*—Nathan Edelberg; John E. Holford; Robert P. Gibson

[57] ABSTRACT

A method is provided for making an improved photocathode wherein a step graded substrate links a semitransparent cathode made from one p-type III-V compound or complex to a different III-V compound in the form of a host crystal.

2 Claims, 1 Drawing Figure

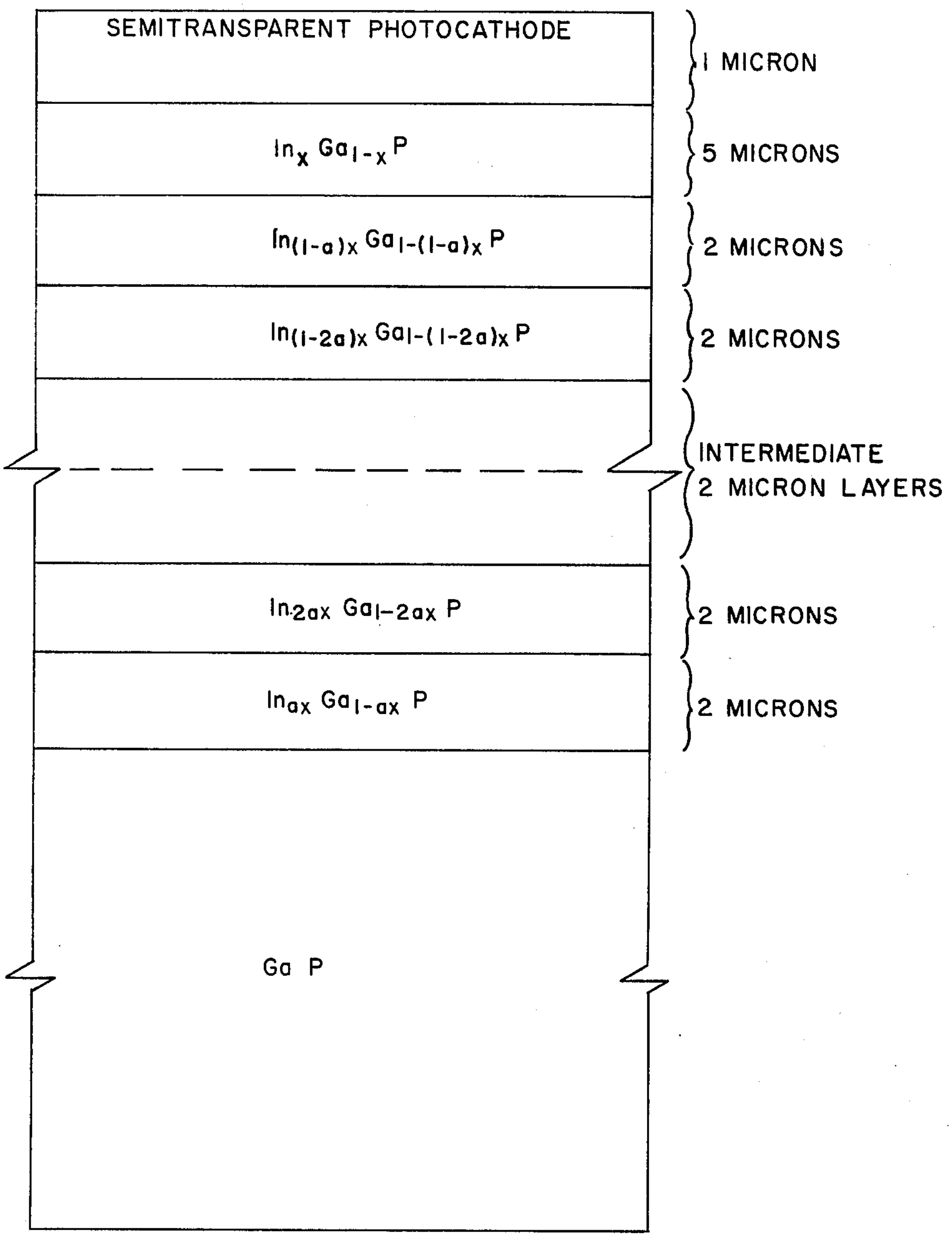
SEMITRANSPARENT PHOTOCATHODE
1 MICRON
$In_x Ga_{1-x} P$
5 MICRONS
$In_{(1-a)x} Ga_{1-(1-a)x} P$
2 MICRONS
$In_{(1-2a)x} Ga_{1-(1-2a)x} P$
2 MICRONS
INTERMEDIATE
2 MICRON LAYERS
$In_{2ax} Ga_{1-2ax} P$
2 MICRONS
$In_{ax} Ga_{1-ax} P$
2 MICRONS
Ga P

STEP GRADED PHOTOCATHODE

The invention described herein was derived in the course of U.S. Government Contract DAAK-02-71-C-0305 with the Department of the Army.

This is a continuation of application Ser. No. 630,234, filed Nov. 10, 1975, now abandoned.

BACKGROUND OF THE INVENTION

There is a real need for efficient photocathodes which operate in the low frequency end of the visible spectrum and in the near infrared. Image intensifiers using such photocathodes permit viewing under moonlight and starlight conditions with a clarity that approaches broad daylight. A particularly useful cathode for this purpose is a monocrystalline p-type gallium arsenide or gallium phosphide epitaxial layer grown on a monocrystalline substrate of the same type material. In an effort to extend the spectral response to cover both invisible and visible regions, mixtures of compounds have been employed. A particularly promising combination is an $In_xGa_{1-x}P$ substrate with a semitransparent $In_yGa_{1-y}As$ photocathode. The substrate is grown on GaP, usually by the vapor hydride method of deposition. To avoid lattice mismatch between the substrate and the GaP host crystai the number of indium atoms in the depositing atmosphere is increased from zero at the beginning of the deposition of the substrate to the level required to deposit $x$ atoms in the stochiometric formula above, where $x$ varies directly and linearly with the thickness of the substrate from zero ot its final value.

While this satisfies the physical requirements for a stable structure and provides the desired dynamic characteristics of broad spectral response, the electron image contains an undesireable cross-hatch pattern which reduces the resolution of image intensifiers in which the cathode is employed. There is also a percentage of growth protuberances, called hillocks, which reduce the resolution in random areas of the image.

BRIEF DESCRIPTION OF INVENTION

An object of the invention is, therefore, to provide a process for the manufacture of epitaxially deposited crystalline photocathodes using two or more compounds with differing lattice parameters so that the strains due to lattice mismatch are minimized and the structural variations have a minimum effect on the electronic images emanating therefrom.

A further object is to provide, through the above process, improved photocathodes and image intensifiers.

BRIEF DESCRIPTION OF DRAWINGS

The drawing shows a greatly enlarged idealized cross-section of a photocathode made by the process of the invention, which also indicates generally the stepwise variations in such a process.

DESCRIPTION OF INVENTION

Gallium arsenide, gallium phosphide or combinations of the two, doped with a p-type impurity are deposited by the vapor hydride method. In this process a host (or seed) crystal is heated in an atmosphere of pure hydrogen and the elements to be deposited are introduced in the form of gases or gaseous compounds, e.g. $AsH_3$, $PH_3$, and InC1, GaC1 from the HC1 transport of In and Ga metals respectively, (see "Vapor-Phase Growth of Several III-V Compound Semiconductors" by J. J. Tietjen, R. E. Enstrom, and D. Richman. RCA Review, December 1970, Volume 31, pp. 635–646). At the surface of the heated crystal the hydrogen reduces the compounds. Layers deposited in this manner closely approach a single crystal in their electrical properties. The resultant structure is mechanically stable as long as the lattice parameters of the material deposited are closely related to that of the host crystal.

Unfortunately the difference in the lattice parameters of semitransparent photocathodes and GaP preclude direct deposition of one on the other. One method of overcoming this is to add a layer of transition material to form a substrate of $In_xGa_{1-x}P$ wherein the number atoms (x) of indium varies from substantially zero at the surface of the GaP host crystal to a value of "$x$" equal to about 0.4 the number of phosphorous atoms. When the exposed surface is covered with a semi-transparent layer of $In_yGa_{1-y}As$ or $GaAs_{1-z}P_z$ a stable photocathode structure is obtained. However, when the cathode is activated by the usual treatment, with cesium and oxygen, and used in an image intensifier tube; a disturbing cross-hatch pattern appears on the screen that substantially reduces the overall resolution of the tube.

As shown in the drawing the present invention proposes to provide a multilayered substrate in which the pattern is greatly reduced by special processing. Instead of depositing the transition layer with a linear variation of the value of "$x$" in the above mentiond stochiometric formula the value of "$x$" is varied in discrete steps by a fraction "$a$". A considerable reduction in the cross-hatch pattern has been achieved by simply varying the percentage of gaseous components suddenly at equal intervals while the process continued. Each time a two micron layer of the substrate is deposited the atmosphere is abruptly adjusted to deposit a new transition layer containing an additional 8 to 10 percent ($a$) of the final mole value ($x$) of indium, with a complimentary reduction in gallium. Upon obtaining the desired value of "$x$", a layer 5 microns thick was deposited.

It has been found that the pattern can be virtually eliminated by further refining the above method. Instead of varying the atmosphere during processing the host crystal is withdrawn from that atmosphere to a heated vestibule containing principally the gaseous compond of phosphorous. This prevents decomposition of the transition layer between steps. When the atmosphere has been adjusted to the mole percentages required for the next step the host crystal is reinserted therein. Once the final layer of $In_xGa_{1-x}P$ is completed and the host crystal removed to its vestibule; the atmosphere is changed to produce a one micron layer of the semitransparent cathode. The host crystal is then cooled to room temperature and subsequently activated with cesium and oxygen is the usual manner well known in the art.

Both of the above methods worked well with final indium atom concentrations ($x$) in the final transition layer between 0.4 to 0.65 that of the phosphorous. The values of "$y$" and "$z$" will generally vary between 0 and 0.5 and 0.45, respectively. The continuous process (with steps) showed a strong dependence of cross-hatch pattern on orientation. Rotating the cathode 45° about an axis normal to its surface varies the resolution from its maximum to its minimum value. This can be a very undesireable feature in image tubes. The temperatures, pressures, flow rates and methods of generating the gases during processing are already established in the literature including the reference by Tietjen, et al mentioned above. Applicant's invention lies in the stepwise application of those methods and the improved photocathode resulting therefrom.

Many variations of the above methods and products will immediately be obvious to those skilled in the art, but applicant's invention is limited only as defined in the claims which follow.

I claim:

1. A III-V photocathode comprising host crystal ofsubstantially pure $III^{A}V$ material;

a series of graded layers of transition material approximately 2 microns thick and having a stochiometric formula $III_{x}^{A}III_{1-x}^{B}V^{M}$ deposited on said host crystals, where the value of x is varied in steps to provide an abrupt increase of 8–10 mole percent of $III^{A}$-V in each successive graded layer as compared with the underlying material, the last of said graded layers containing between 30 – 58 mole percent of $III^{A}V$;

final layer of said transition material containing 40 – 65 percent of $III^{A}V$ approximately 5 microns thick deposited over the last of said graded layers; and a photocathode layer composed of III-V compounds at least one of which is different from those in said transition material deposited on said final layer and activated with cesium vapor and oxygen.

2. The photocathode according to Claim 1 wherein the $III^{A}$ element is Indium;

the $III^{B}$ element is Gallium;

the $V^{M}$ element is Phosphorous;

the $III^{C}$ element is Indium;

the $III^{D}$ element is Gallium; and the $V^{N}$ element is Arsenic.

* * * * *